(12) United States Patent
Tak et al.

(10) Patent No.: US 8,134,202 B2
(45) Date of Patent: Mar. 13, 2012

(54) CAPACITORLESS ONE-TRANSISTOR SEMICONDUCTOR MEMORY DEVICE HAVING IMPROVED DATA RETENTION ABILITIES AND OPERATION CHARACTERISTICS

(75) Inventors: Nam-Kyun Tak, Bucheon-si (KR); Ki-Whan Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 12/453,036

(22) Filed: Apr. 28, 2009

(65) Prior Publication Data

US 2009/0278194 A1  Nov. 12, 2009

(30) Foreign Application Priority Data

May 6, 2008  (KR) .................. 10-2008-0041784

(51) Int. Cl.
*H01L 29/792* (2006.01)
(52) U.S. Cl. .......... 257/324; 257/E29.309; 257/E29.273
(58) Field of Classification Search .................. 257/324, 257/E29.309, E29.273
See application file for complete search history.

(56) References Cited

U.S. PATENT DOCUMENTS

| | | | |
|---|---|---|---|
| 5,146,152 A | 9/1992 | Jin et al. | |
| 5,953,263 A | 9/1999 | Farmwald et al. | |
| 5,998,840 A | 12/1999 | Kim | |
| 6,055,183 A | 4/2000 | Ho et al. | |
| 6,060,750 A * | 5/2000 | Hisamoto et al. | 257/353 |
| 6,084,812 A | 7/2000 | Joo | |
| 6,147,903 A | 11/2000 | Takahashi | |
| 6,475,890 B1 | 11/2002 | Yu | |
| 6,528,846 B1 | 3/2003 | Nowak et al. | |
| 6,567,330 B2 | 5/2003 | Fujita et al. | |
| 6,621,725 B2 | 9/2003 | Ohsawa | |
| 6,697,909 B1 | 2/2004 | Wang et al. | |
| 6,723,638 B1 * | 4/2004 | He et al. | 438/663 |
| 6,826,074 B2 | 11/2004 | Yamauchi | |
| 6,861,689 B2 | 3/2005 | Burnett | |
| 6,861,889 B2 | 3/2005 | Tobita | |
| 6,882,008 B1 | 4/2005 | Ohsawa | |
| 6,960,805 B2 | 11/2005 | Ahn et al. | |

(Continued)

FOREIGN PATENT DOCUMENTS

JP 04-366492 A 12/1992

(Continued)

OTHER PUBLICATIONS

Cho, Changhyun, "A 6F$^2$ DRAM Technology in 60nm era for Gigabit Densities", 2005 Symposium on VLSI Technology Digest of Technical Papers, pp. 36-37, (2005).

(Continued)

*Primary Examiner* — Matthew Reames
(74) *Attorney, Agent, or Firm* — Lee & Morse, P.C.

(57) ABSTRACT

A capacitorless one transistor (1T) semiconductor device whose data storage abilities are increased and leakage current is reduced is provided. The capacitor-less 1T semiconductor device includes a buried insulating layer formed on a substrate, an active region formed on the buried insulating layer and including a source region, a drain region and a floating body formed between the source region and the drain region, and a gate pattern formed on the floating body, wherein the floating body includes a main floating body having the same top surface height as one of the source region and the drain region, and a first upper floating body formed between the main floating body and the gate pattern.

18 Claims, 13 Drawing Sheets

U.S. PATENT DOCUMENTS

| | | | |
|---|---|---|---|
| 6,982,918 B2 | 1/2006 | Fazan et al. | |
| 7,035,147 B2 | 4/2006 | Yeh et al. | |
| 7,064,973 B2 | 6/2006 | Peng et al. | |
| 7,075,151 B2 | 7/2006 | Shino | |
| 7,098,507 B2 | 8/2006 | Tang et al. | |
| 7,154,788 B2 | 12/2006 | Takemura et al. | |
| 7,170,807 B2 | 1/2007 | Fazan et al. | |
| 7,187,581 B2 | 3/2007 | Ferrant et al. | |
| 7,233,536 B2 | 6/2007 | Ogiwara et al. | |
| 7,301,803 B2 | 11/2007 | Okhonin et al. | |
| 7,326,634 B2 | 2/2008 | Lindert et al. | |
| 7,338,862 B2 | 3/2008 | Huo et al. | |
| 7,436,724 B2 | 10/2008 | Nandi | |
| 7,442,988 B2 | 10/2008 | Oh et al. | |
| 7,872,840 B1 | 1/2011 | Vashchenko et al. | |
| 7,924,644 B2 | 4/2011 | Park et al. | |
| 2002/0057622 A1 | 5/2002 | Sim | |
| 2003/0231524 A1 | 12/2003 | Ohsawa | |
| 2004/0256683 A1* | 12/2004 | Lee et al. | 257/412 |
| 2005/0026354 A1 | 2/2005 | Bhattacharyya | |
| 2005/0068807 A1 | 3/2005 | Ohsawa | |
| 2005/0180214 A1 | 8/2005 | Park | |
| 2006/0081851 A1 | 4/2006 | Ono | |
| 2006/0092739 A1 | 5/2006 | Fujita et al. | |
| 2006/0138558 A1 | 6/2006 | Morikado | |
| 2006/0208301 A1 | 9/2006 | Shino | |
| 2007/0007574 A1 | 1/2007 | Ohsawa | |
| 2007/0013007 A1 | 1/2007 | Kusunoki et al. | |
| 2007/0023809 A1 | 2/2007 | Villaret et al. | |
| 2007/0051994 A1 | 3/2007 | Song et al. | |
| 2007/0058427 A1 | 3/2007 | Okhonin et al. | |
| 2007/0090443 A1* | 4/2007 | Choi et al. | 257/314 |
| 2007/0091703 A1 | 4/2007 | Nishimura et al. | |
| 2007/0097751 A1 | 5/2007 | Popoff et al. | |
| 2007/0158727 A1 | 7/2007 | Song et al. | |
| 2007/0161181 A1 | 7/2007 | Song et al. | |
| 2007/0285982 A1 | 12/2007 | Carman | |
| 2008/0012439 A1 | 1/2008 | Wu et al. | |
| 2008/0123439 A1 | 5/2008 | Park et al. | |
| 2008/0130376 A1 | 6/2008 | Park et al. | |
| 2008/0278473 A1 | 11/2008 | An | |
| 2008/0284493 A1 | 11/2008 | Baek et al. | |
| 2008/0303095 A1* | 12/2008 | Xiong et al. | 257/365 |
| 2009/0026519 A1* | 1/2009 | Jin et al. | 257/314 |
| 2010/0149886 A1 | 6/2010 | Song et al. | |

FOREIGN PATENT DOCUMENTS

| | | |
|---|---|---|
| JP | 2003-031696 A | 1/2003 |
| JP | 2003-068877 A | 3/2003 |
| JP | 2003-132682 A | 5/2003 |
| JP | 2006-085812 A | 3/2006 |
| JP | 2006-107560 A | 4/2006 |
| JP | 2006-108396 A | 4/2006 |
| JP | 2006-156986 A | 6/2006 |
| JP | 2006-179746 A | 7/2006 |
| JP | 2006-260722 A | 9/2006 |
| JP | 2007-018588 A | 1/2007 |
| JP | 2007-036257 A | 2/2007 |
| JP | 2007-073680 A | 3/2007 |
| KR | 10-1994-0003406 A | 2/1994 |
| KR | 10-0248507 B1 | 12/1999 |
| KR | 10-2002-0014757 A | 2/2002 |
| KR | 10-2003-0015823 A | 2/2003 |
| KR | 10-0429868 B1 | 4/2004 |
| KR | 10-2005-0071665 A | 7/2005 |
| KR | 10-2006-0104794 A | 10/2006 |
| KR | 10-0660910 B1 | 12/2006 |
| KR | 10-0673012 B1 | 1/2007 |
| KR | 10-0682537 B1 | 2/2007 |
| KR | 10-0699890 B1 | 3/2007 |
| KR | 10 2008-0047105 A | 5/2008 |
| KR | 10-2008-0058806 A | 6/2008 |

OTHER PUBLICATIONS

Jeong, Hoon, et al., "A Capacitor-less IT DRAM Cell Based on a Surrounding Gate MOSFET with a Vertical Channel", 2005 IEEE Silicon Nanoelectronics Workshop, pp. 92-93 (2005).

Oh, Chang Woo, et al., "Floating Body DRAM Chracteristics of Silicon-On-ONO (SOONO) Devices for System-on-Chip (SoC) Applications", 2007 Symposium on VLSI Technology Digest of Technical Papers, pp. 168-169, (2007).

Ohsawa, Takashi, et al., "Memory Design Using a One-Transistor Gain Cell on SOI", IEEE Journal of Solid-State Circuits, vol. 37, No. 11, pp. 1510-1522, (2002).

Ohsawa, Takashi, et al., "A Memory Using One-Transistor Gain Cell on SOI(FBC) with Performance Suitable for Embedded DRAM's", 2003 Symposium on VLSI Circuits Digest of Technical Papers, pp. 93-96, (2003).

Ohsawa, Takashi, et al., "An 18.5ns 128Mb SOI DRAM with a Floating Body Cell", 2005 IEEE International Solid-State Circuits Conference, pp. 458, 459, 609, (2005).

Ota, K., et al., "Novel Locally Strained Channel Technique for High Performance 55nm CMOS", IEDM, pp. 27-30, IEEE ©2002.

"Capacitor-less IT DRAM cell structure for sensing margin and retention time enhancement", 2007 The Korean Conference on Semiconductors, 2 pg. (2007).

Matloubian, et al.; Modeling of the Subthreshold Characteristics of SOI MOSFET's with Floating Body; IEEE Transactions on Electron Devices; Sep. 1990; pp. 1985-1989; vol. 37, No. 9; IEEE; United States.

Bron, et al.; A 2ns Read Latency, 4Mb Embedded Z-RAM® Floating Body Memory Macro in 45nm SOI Technology; Innovative Silicon, Lausanne, Switzerland.

Song, et al.; 55nm Capacitor-less IT DRAM Cell Transistor with Non-Overlap Structure; Samsung Electronics Co., Hwasung, Gyeonggi, Korea, 2008.

Ohsawa, et al.; Memory Design Using a One-Transistor Gain Cell on SOI; Nov. 2002; 1510-1522; vol. 37, No. 11; IEEE Journal of Solid State Circuits.

* cited by examiner

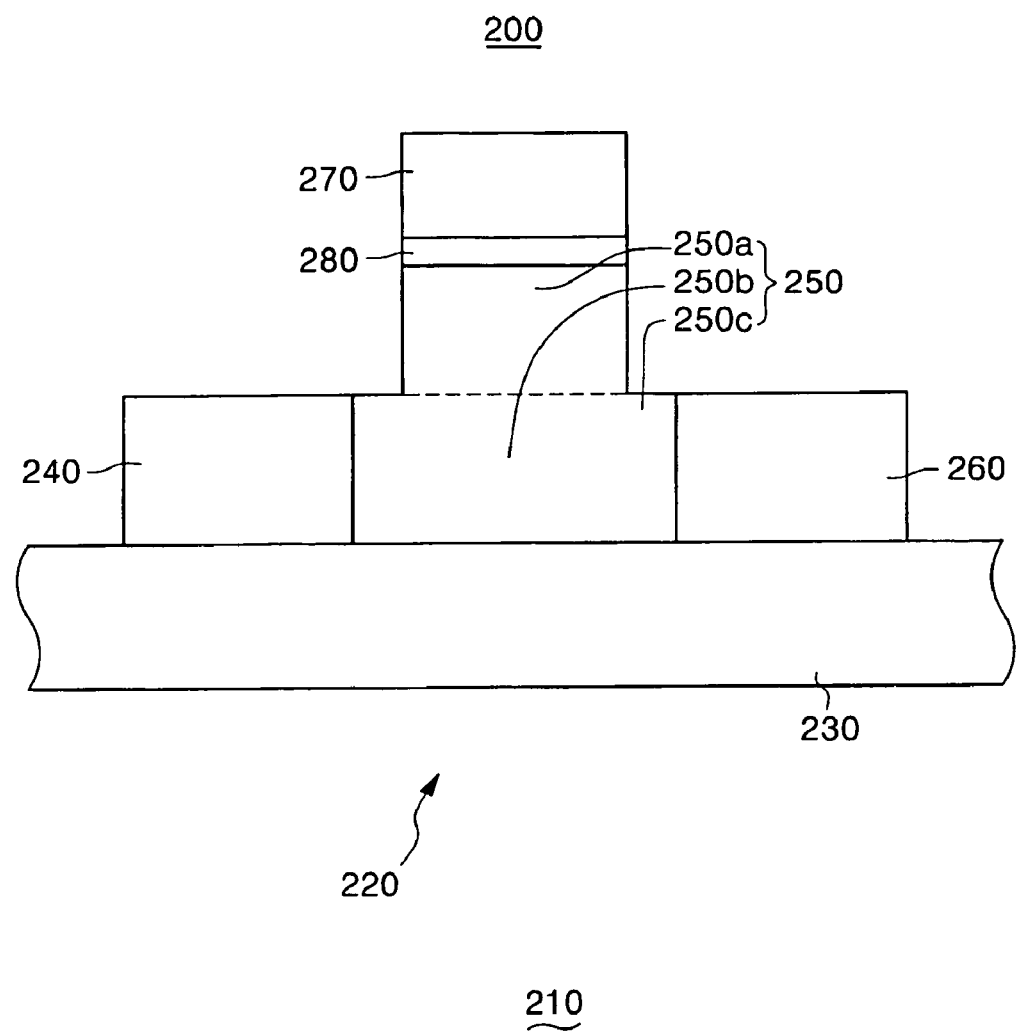

I ←——→ I'

400b

I ⟷ I'

500a

I ⟵⟶ I'

500b

I ⟷ I'

CAPACITORLESS ONE-TRANSISTOR SEMICONDUCTOR MEMORY DEVICE HAVING IMPROVED DATA RETENTION ABILITIES AND OPERATION CHARACTERISTICS

CROSS-REFERENCE TO RELATED APPLICATIONS

This application is related to U.S. application Ser. No. 12/171,406 filed Jul. 11, 2008, U.S. application Ser. No. 12/285,520 filed Oct. 8, 2008, U.S. application Ser. No. 12/348,036 filed Jan. 2, 2009, and U.S. application Ser. No. 12/654,333 filed Dec. 17, 2009, all pending.

BACKGROUND

1. Field

Exemplary embodiments relate to a capacitorless one transistor (1T) semiconductor memory device capable of performing semiconductor memory operations using only one transistor without capacitors.

2. Description of Related Art

Among methods of implementing and improving high integration of a semiconductor memory device, a capacitorless 1T semiconductor memory device, which is capable of storing data using only one transistor without a capacitor, has been drawing an increasing amount of attention. For example, since the capacitorless 1T semiconductor memory device does not require a capacitor, which has heretofore been used for a DRAM device, it may facilitate enhanced integration of the semiconductor memory device and simplify its fabrication process. Therefore, the capacitorless 1T semiconductor memory device has attracted considerable attention as a next generation semiconductor memory device to replace a semiconductor device using a capacitor, which seems to have reached its limit. For example, the capacitorless 1T semiconductor memory device may have a structure similar to a MOS structure, and may perform bipolar junction transistor (BJT) operations.

SUMMARY

Exemplary embodiments are directed to a capacitorless 1T semiconductor memory device, which substantially overcomes one or more of the disadvantages and shortcomings of the related art.

It is therefore a feature of an exemplary embodiment to provide a capacitorless 1T semiconductor memory device exhibiting increased data retention ability.

It is another feature of an exemplary embodiment to provide a capacitorless 1T semiconductor memory device exhibiting increased data sensing margin.

It is yet another feature of an exemplary embodiment to provide a capacitorless 1T semiconductor memory device exhibiting increased operation characteristics.

At least one of the above and other features and advantages may be realized by providing a capacitorless 1T semiconductor memory device, including a buried insulating layer formed on a substrate, an active region formed on the buried insulating layer and including a source region, a drain region and a floating body formed between the source region and the drain region, and a gate pattern formed on the floating body, wherein the floating body includes a main floating body and a first upper floating body, top surfaces of the main floating body and at least one of the source region and the drain region facing away from the buried insulating layer and being substantially coplanar, and the first upper floating body being between the main floating body and the gate pattern. The gate pattern may include a gate insulating layer on the first upper floating body, and a gate electrode on the gate insulating layer, the gate electrode overlapping a top surface and at least one side surface of the first upper floating body.

The gate electrode may overlap at least two side surfaces of the first upper floating body. The gate electrode may overlap at least two side surfaces of the main floating body. The first upper floating body may include first type impurity ions at a first concentration, and the main floating body may include the first type impurity ions at a second concentration, the first concentration being higher than the second concentration. The floating body may further include a second upper floating body between the first upper floating body and the main floating body. The second upper floating body may include second type impurity ions at a third concentration. The floating body may further include a flank floating body, the flank floating body having a top surface at a lower height than a top surface of the upper floating body, the flank floating body being positioned between the main floating body and at least one of the source and drain regions. The flank floating body may include no overlaps with the gate electrode. The flank floating body may extend in a horizontal direction from the first upper floating body. The flank floating body may include the same impurities as the main floating body at a substantially same concentration or lower. The main floating body and the first upper floating body may be integral with each other.

At least one of the above and other features and advantages may be also realized by providing a capacitorless 1T semiconductor memory device, including a buried insulating layer formed on a substrate, an active region formed on the buried insulating layer and including a source region, a drain region and a floating body formed between the source region and the drain region, and a gate pattern formed on the floating body, wherein the floating body includes a main floating body and a charge storage pattern, top surfaces of the main floating body and at least one of the source region and the drain region facing away from the buried insulating layer and being substantially coplanar, and the charge storage pattern being between the main floating body and the gate pattern, and wherein the charge storage pattern includes a charge storage insulating layer on the main floating body, and a charge storage unit on the charge storage insulating layer.

The charge storage unit may include a conductor. The charge storage unit may include at least one of doped silicon, metal, and metal silicide. The gate pattern may include a gate insulating layer on the charge storage pattern, and a gate electrode on the gate insulating layer, the gate electrode overlapping at least two side surfaces of the charge storage pattern. The gate electrode may overlap at least two side surfaces of the main floating body. The floating body may include a flank floating body having a top surface at a lower height than the charge storage pattern and adjacent to at least one of the source and drain regions, the flank floating body having no overlaps with the gate electrode. The device may further include an upper floating body between the main floating body and the charge storage insulating layer, the upper floating body including same impurity ions as the main floating body at a higher concentration. The charge storage unit may include a dielectric material. The charge storage unit may include at least one of a silicon nitride layer, a silicon oxynitride layer, a hafnium oxide layer, an aluminum oxide layer, a titanium oxide layer, a tantalum oxide layer, and a carbon-based layer.

BRIEF DESCRIPTION OF THE DRAWINGS

The above and other features and advantages will become more apparent to those of ordinary skill in the art by describing in detail exemplary embodiments with reference to the attached drawings, in which:

FIG. 3 illustrates a schematic cross-sectional view of a unit cell of a capacitorless 1T semiconductor memory device according to another exemplary embodiment;

DETAILED DESCRIPTION OF THE EMBODIMENTS

Figure 1:
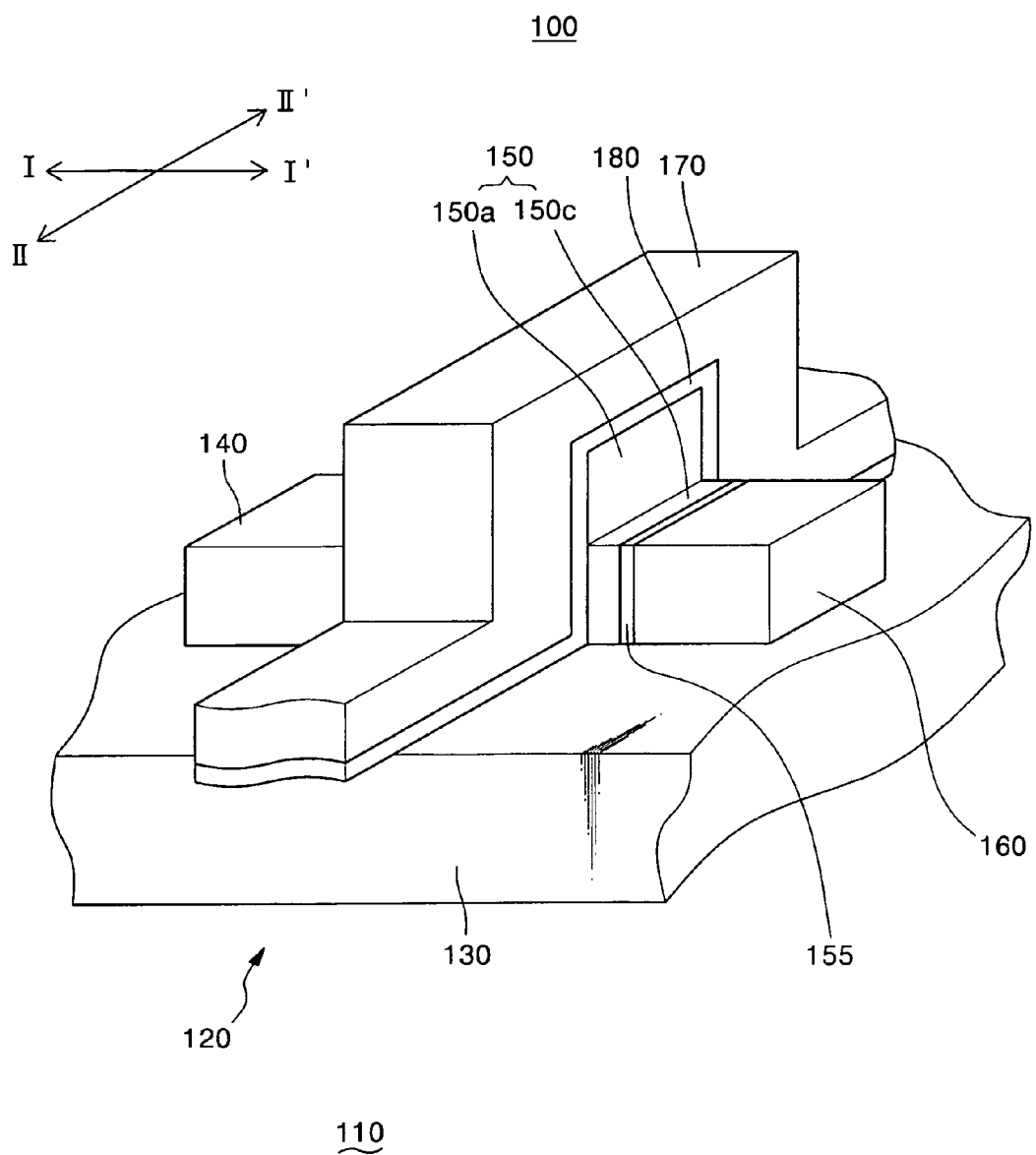
FIG. 1 illustrates a schematic perspective view of a unit cell of a capacitorless 1T semiconductor memory device according to an exemplary embodiment.

Korean Patent Application No. 10-2008-0041784, filed on May 6, 2008, in the Korean Intellectual Property Office, and entitled: "Capacitorless One Transistor Semiconductor Memory Device Having Improved Data Retention Abilities and Operation Characteristics," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. As used herein, the terms "a" and "an" are open terms that may be used in conjunction with singular items or with plural items. Like reference numerals refer to like elements throughout.

Exemplary embodiments provide a capacitorless 1T semiconductor memory device having improved data retention characteristics. For example, according to exemplary embodiments, a capacitorless 1T semiconductor memory device may include a floating body having an increased charge capacity, so when the floating body captures a sufficient amount of charge, even if a small amount of charge leaks, stored data may be maintained in the capacitorless 1T semiconductor memory for a sufficient time period. That is, data retention characteristics of the capacitorless 1T semiconductor memory may be improved. According to exemplary embodiments, the increased charge capacity of the floating body may be achieved by increasing a volume of the floating body, reducing a charge leakage path, and increasing a doping concentration, e.g., increasing an amount of impurities.

In addition, a capacitorless 1T semiconductor memory device according to exemplary embodiments may exhibit high gain and multiplication efficiency of charge in BJT operations. For example, an increasing gain may be achieved by appropriately maintaining a channel width of a base node. This is because applying a uniform bias to a junction between the base node and other nodes may enhance multiplication efficiency of charge. In other words, as compared to, e.g., MOS, the channel width of the base node (a floating body) may be appropriately maintained, so a path through which current flows may not be localized, thereby increasing gain and multiplication efficiency of charges.

In addition, a capacitorless 1T semiconductor memory device according to exemplary embodiments may exhibit improved data sensing margins. For example, according to exemplary embodiments, a capacitorless 1T semiconductor memory device may include increased change in an amount of charge that is captured in the floating body in order to increase the data sensing margin. That is, the data sensing margin may be increased when, e.g., a difference in the amounts of charges captured in first and second floating bodies where data "1" and date "0" are stored, respectively, is increased.

Also, a capacitorless 1T semiconductor memory device according to exemplary embodiments may exhibit improved operation. For example, the improved operation of the capacitorless 1T semiconductor memory device may be achieved by reducing potential variations in floating bodyies caused by voltages applied to source regions and drain regions, i.e., reducing source (bit) line disturbance. This means that influence of the source (bit) line disturbance on charge stored in the floating body of the capacitorless 1T semiconductor memory device according to exemplary embodiments may be reduced to improve operation of the memory device. It is noted that the source (bit) line disturbance may trigger leakage of charge stored in the floating body. The potential of the floating body may refer to the amount of charge stored in the floating body. For example, a voltage applied to a gate electrode may be one factor having an effect on the potential variations of the floating body. According to example embodiments, as the potential of the floating body controlled by the voltage applied to the gate electrode increases, operation may improve. This means that the potential of the floating body may be less influenced by the source (bit) line disturbance, and may be more influenced by the gate electrode. In this case, data retention characteristics of the capacitorless 1T semiconductor device according to example embodiments may be improved.

Further, a capacitorless 1T semiconductor memory device according to exemplary embodiments may exhibit reduced dependency of physical properties of a base node region on temperature. For example, the physical properties of the base node region may be less changed by heat.

A capacitorless 1T semiconductor memory device with excellent characteristics is provided according to example embodiments. A capacitorless 1T semiconductor memory device according to an exemplary embodiment will be described hereinafter with reference to FIGS. 1-2B. In the figures, the active regions are illustrated in a hexagonal or mesa shape. However, it is noted that the illustration of shapes of elements in FIG. 1 is schematic in order to facilitate understanding of the technical features of the inventive concept. For example, in a real device, any corner or angle may not be formed on the surface, and may be formed in various shapes.

Figure 2A:
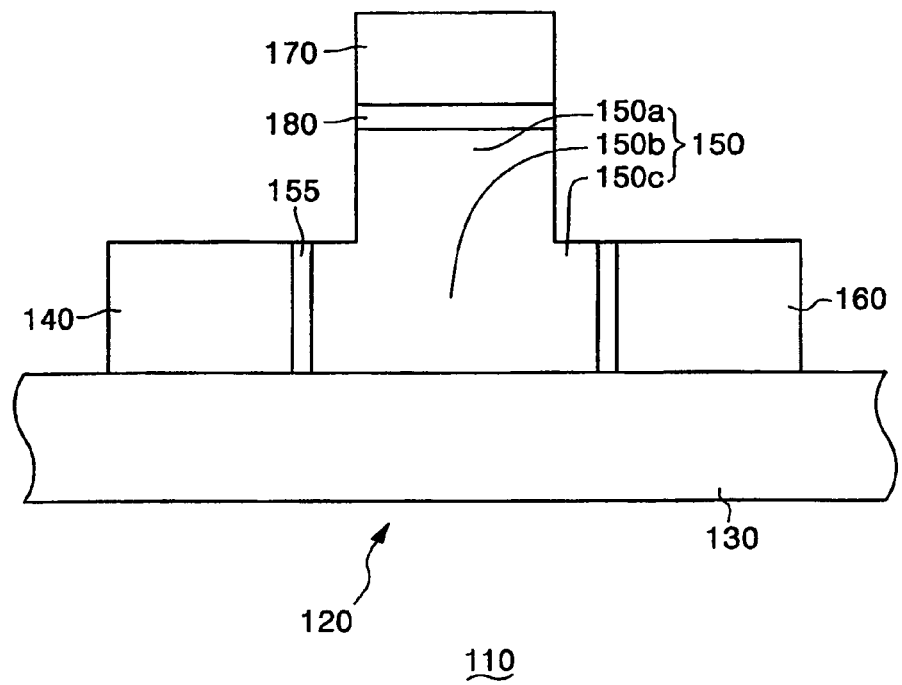
FIGS. 2A and 2B illustrate schematic cross-sectional views of the unit cell of FIG. 1.
Figure 2B:
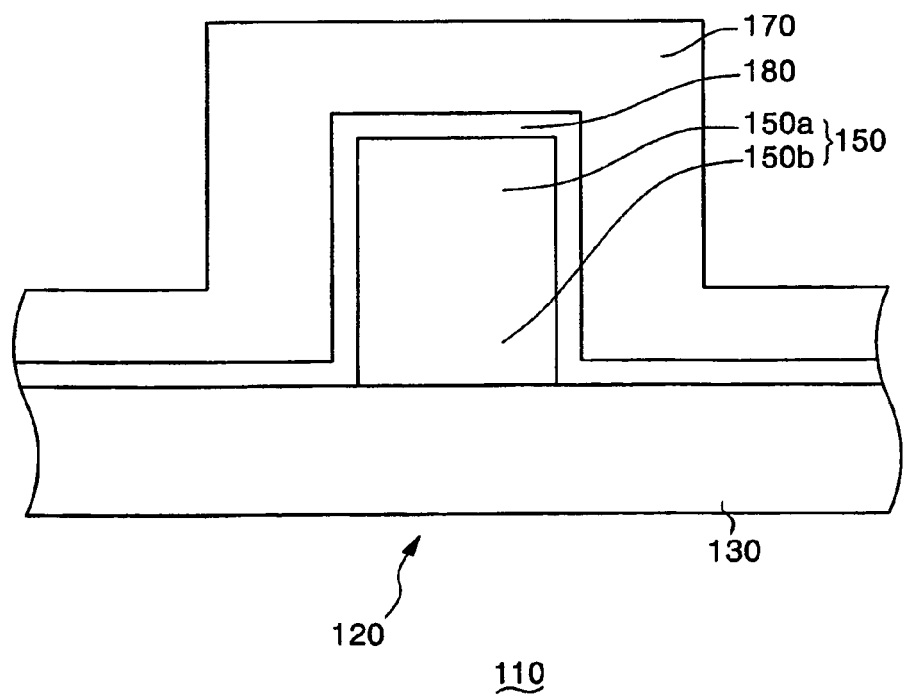

FIG. 1 illustrates a schematic perspective view of a unit cell of a capacitorless 1T semiconductor memory device according to an exemplary embodiment. FIGS. 2A and 2B illustrate cross-sectional views of the unit cell of FIG. 1 along lines I-I' and II-II' of FIG. 1, respectively.

Referring to FIG. 1, a unit cell 100 of a capacitorless 1T semiconductor memory device according to an exemplary embodiment may include a buried insulating layer 130 formed on a substrate 110, active regions 140 and 160 formed on the buried insulating layer 130, a floating body 150 on the buried insulating layer 130, and gate patterns 170 and 180. It is noted that the floating body 150 is an active region, and therefore, the terms "floating body 150" and "active region 150" may be used interchangeably hereinafter.

The substrate 110 may be any suitable semiconductor substrate. For example, the substrate 110 may be a silicon-on-insulator (SOI) substrate, a silicon on oxide-nitride-oxide (SOONO) substrate, etc. Any suitable technique may be used during manufacturing. While the descriptions of the techniques are omitted, one of ordinary skill in the art would have sufficient knowledge to combine those techniques with the technical feature of the example embodiment.

A bulk 120 illustrated in FIG. 1 may refer to a body of the substrate 110, e.g., manufactured via bulk technology. Any suitable methods may be used to form the bulk 120. The buried insulating layer 130 may be formed of an insulating material, e.g., an insulating layer of an SOI substrate, and may be buried in the substrate 110. The buried insulating layer 130 may electrically insulate the bulk 120 from the active regions 140, 150, and 160. For example, the floating body 150 may be electrically floated by the buried insulating layer 130. The buried insulating layer 130 may be formed, e.g., of silicon oxide.

The active regions 140, 150, and 160 may include a source region 140, a floating body 150, and a drain region 160, respectively. It is noted that the terms "active region 140" and "source region 140" may be used interchangeably hereinafter. Similarly, the terms "active region 160" and "drain region 160" may be used interchangeably hereinafter. In the exemplary embodiment, the active regions 140, 150, and 160 may be formed on the buried insulating layer 130. The active regions 140, 150, and 160 of the unit cell 100 of the capacitorless 1T semiconductor memory device according to the exemplary embodiment may have any suitable shape, e.g., the active regions 140, 150, and 160 may be formed in a projected island shape, i.e., a FIN shape.

The source region 140 may be electrically connected to a source line of the capacitorless 1T semiconductor memory device, and the drain region 160 may be electrically connected to a bit line of the capacitorless 1T semiconductor memory device. However, the source and drain regions 140 and 160 may have a symmetrical structure, and thus, both source and drain regions 140 and 160 may be considered with their positions changed. While not illustrated, a contact plug may be formed on the source region 140 and the drain region 160. In order to facilitate understanding of the technical features of the exemplary embodiments and to avoid complicating the drawings, contact plugs and interconnections are not illustrated.

According to exemplary embodiments, the unit cell 100 of the capacitorless 1T semiconductor memory device may operate as a BJT, so the active regions 140, 150, and 160 may form one BJT to operate. In this case, the source region 140 may be an emitter node, and the drain region 160 may be a collector node. For example, the active regions 140, 150, and 160 may form an NPN or PNP junction transistor to operate. Therefore, the same polarity ions may be implanted into the source region 140 and the drain region 160. For example, N-type impurities may be implanted into the active regions 140 and 160 to form an NPN transistor. Reference numeral 155 denotes a junction, i.e., a junction that may be formed between the source region 140 and the floating body 150 or between the floating body 150 and the drain region 160. The junction 155 may be formed by any suitable technique.

The floating body 150 may correspond to a well region or a channel region of a MOSFET, and may correspond to a base node of a BJT. Therefore, the floating body 150 may be described hereinafter as a channel region or a base node depending on the circumstances. This applies to the above-described source region 140 and drain region 160 as well. Specifically, active regions 140 and 160 may be referred to as an emitter node and a collector node, or vice versa.

As illustrated in FIGS. 1-2B, the floating body 150 may include a main floating body 150b, an upper floating body 150a, and at least one flank floating body 150c. The main floating body 150b, the upper floating body 150a, and the at least one flank floating body 150c may not be physically or electrically separated from each other. That is, the main floating body 150b, the upper floating body 150a, and the at least one flank floating body 150c may be formed as an integral unit on the buried insulating layer 130.

As illustrated in FIG. 2A, the main floating body 150b may be positioned on, e.g., directly on, the buried insulating layer 130, and may have a substantially same top surface height as the source region 140 or the drain region 160. In other words, a top surface, i.e., a surface facing away from the buried insulating layer 130, of the main floating body 150b may be substantially level with top surfaces, i.e., surfaces facing away from the buried insulating layer 130, of the drain and source regions 140 and 160. Accordingly, a height of the top surface of the main floating body 150b may substantially equal heights of top surfaces of the source and drain regions 140 and 160, i.e., as measured from a common references point to the respective top surfaces. In this respect, it is noted that the "top surface" of the main floating body 150b refers to an imaginary interface line between the main and upper floating bodies 150b and 150a (e.g., dashed line in FIG. 3A).

The upper floating body 150a may be formed on the main floating body 150b. In other words, the floating body 150 may be formed in a shape elevated in a vertical direction with respect to the source region 140 and the drain region 160. Accordingly, a distance between the buried insulating layer 130 and a top surface, i.e., a surface facing away from the buried insulating layer 130, of the upper floating body 150a may be larger than a distance between the buried insulating layer 130 and the top surfaces of the source and drain regions 140 and 160. The upper floating body 150a may be directly on and integral with the main floating body 150b. The upper floating body 150a may be formed not to be in direct physical contact with the source region 140 and the drain region 160. Since the upper floating body 150a is a part of the floating body 150, i.e., the main and upper floating bodies 150b and 150a are integral with each other, the upper floating body 150a may increase a volume of the floating body 150, as compared with a floating body having only a main floating body. Accordingly, since the volume of the floating body 150 may be increased, charge capacity may be increased. Also, impurity concentration of the main floating body 150b relative to the upper floating body 150a may be adjusted, so a charge leakage path may be reduced. A width of the upper and main floating bodies 150a and 150b along a direction parallel to the buried insulating layer 130 may be substantially the same.

The at least one flank floating body 150c may be an element formed by extending from the main floating body 150b on the buried insulating layer 130. For example, the flank floating body 150c may be formed between the main floating body 150b and the source region 140 and/or between the main floating body 150b and the drain region 160. For example, a top surface of the flank floating body 150c may be substantially level with the top surfaces of the drain and source regions 140 and 160. If a flank floating body 150c is formed on each side of the main floating body 150b to be in contact with respective source region 140 and the drain region 160, as illustrated in FIG. 2A, the floating body 150 may have an inverted T-shaped cross-section. If a flank floating body 150c is formed only on one side of the main floating body to be in contact with either the source region 140 or the drain region 160 (not shown), the floating body 150 may have an L-shaped cross-section.

In the exemplary embodiment, since the floating bodies 150a, 150b, and 150c are formed as an integral unit, they may have the same impurity concentration. Alternatively, the impurity concentration may be adjusted, as discussed previously, e.g., the flank floating body 150c and the main floating body 150b may include a same impurity type, but the main floating body 150b may have a lower impurity concentration than the flank floating body.

The gate patterns 170 and 180 may include a gate electrode 170 and a gate insulating layer 180, respectively. Accordingly, hereinafter, the terms "gate pattern 170" and "gate electrode 170" may be used interchangeably, and the terms "gate pattern 180" and "gate insulating layer 180" may be used interchangeably. In the exemplary embodiment, the gate electrode 170 may be formed adjacent to a top surface and two side surfaces of the upper floating body 150a with the insulating layer 180 interposed therebetween. Also, the gate electrode 170 may be formed adjacent to two side surfaces of the main floating body 150b with the insulating layer 180 interposed therebetween. In other words, the gate electrode 170 may extend lengthwise along a direction perpendicular to a direction of a lengthwise direction of the buried insulating layer 130, as illustrated in FIG. 1. Widths of the gate electrode 170, insulating layer 180, and the upper floating body 150a along a lengthwise direction of the buried insulating layer 130 may be substantially equal, as illustrated in FIG. 2A. The gate electrode 170 may be formed to extend conformally along top and side surfaces of the floating body 150 with the insulating layer 180 interposed therebetween, so the gate electrode 170 may overlap tops and side surfaces of the upper floating body 150a and side surfaces of the main floating body 150b. Thus, the floating body 150 may be electrically coupled to the gate electrode 170 with the insulating layer 180 interposed therebetween.

In the unit cell 100 of the capacitorless 1T semiconductor memory device according to an exemplary embodiment, since the floating body 150 has an increased volume, i.e., an increased surface area external to the buried insulating layer 130, a surface area of the floating body 150 overlapped by the gate electrode 170 may be increased. In other words, a surface area of the floating body 150 overlapped by the gate electrode 170 may increase by a surface area of two side surfaces of the upper floating body 150a. The term "being controlled" may be construed as being coupled to. Accordingly, when an area where the floating body 150 is controlled by or coupled to the gate electrode 170 is increased, a potential of the floating body 150 may be increased, thereby improving operation of the semiconductor memory device, as discussed previously with respect to advantages that can be obtained when the potential of the floating body 150 is increased.

In the exemplary embodiment, the flank floating body 150c may be formed not to be in contact with the gate electrode 170. In other words, the flank floating body 150c may not be directly coupled to the gate electrode 170. Accordingly, the flank floating body 150c may reduce control of the source region 140 or the drain region 160 by the gate electrode 170. This means that gate induced drain leakage (GIDL) may be reduced. In particular, as illustrated in FIGS. 1 and 2A, the flank floating body 150c may define a portion of the floating body 150 that may not be overlapped by the gate electrode 170. That is, the flank floating body 150c and the gate patterns 170 and 180 may not have overlapping portions. In other words, the flank floating body 150c may be defined as a portion not overlapping the gate patterns 170 and 180 among the source region 140 or the drain region 160.

In the exemplary embodiment, when a total volume of the floating body 150, i.e., including the upper floating body 150a, is not considerably different from a total volume of a conventional floating body, i.e., without an upper floating body, the total volume of the floating body 150 according to example embodiments may be considered greater than that of the source region 140 or the drain region 160 of the active regions 140, 150 and 160. In other words, compared with the conventional structure or shape of the conventional floating body, a size of a junction between the floating body 150 and the source region 140 or between the floating body 150 and the drain region 160 may be reduced. Advantages of the technical features and exemplary embodiments have been previously described, and thus will not be repeated.

As illustrated in FIG. 1, the upper floating body 150a may be formed on the main floating body 150b, and the flank floating body 150c may be formed between the source region 140 and the main floating body 150b and/or between the main floating body 150b and the drain region 160. In the drawing, while it is illustrated that the flank floating body 150c is formed between the source region 140 and the main floating body 150b and between the main floating body 150b and the drain region 160, it may be formed in only one of them.

The volume of the upper floating body 150a and the flank floating body 150c may be variously set. This is because various characteristics may be required depending on features of a device, an environment in which it is to be used, user's demand, etc.

In the exemplary embodiment, the volume of the floating body 150 may be increased. Therefore, even if only one of the upper floating body 150a and the flank floating body 150c is formed, the volume may be increased sufficiently to increase charge capacity in the semiconductor memory device. That is, only the upper floating body 150a may be formed or only the flank floating body 150c may be formed. Further, the flank floating body 150c may be formed in only one of the source region 140 and the drain region 160.

With respect to FIG. 2A, it is noted that various aspects of the drawings may have been exaggerated for clarity. For example, the junction 155 is a microscopic portion that may be difficult to identify, e.g., visually. As noted above, details of the junction 155 will not be described below.

Referring to FIG. 2B, the floating body 150 of the unit cell 100 of the capacitorless 1T semiconductor memory device according to an exemplary embodiment may have a top surface and two side surfaces of a cross-sectional surface, which are coupled, e.g., overlapped, by the gate patterns 170 and 180. That is, the top surface and two side surfaces of a cross-sectional surface of the floating body 150 may be coupled to the gate electrode 170, and the floating body 150 may be coupled in different shapes. This is because the floating body

150 may appear in different ways depending on shapes formed on the buried insulating layer 130.

FIG. 3 illustrates a schematic cross-sectional view of a unit cell of a capacitorless 1T semiconductor memory device according to another exemplary embodiment. Conceptually, FIG. 3 illustrates a cross-sectional view corresponding to the configuration illustrated in FIG. 2A, i.e., a cross-section along line I-I' of a semiconductor memory device configured as the semiconductor memory device of FIG. 1. Referring to FIG. 3, a unit cell 200 may include a buried insulating layer 230 formed on a substrate 210, active regions 240, 250, and 260 formed on the buried insulating layer 230, and gate patterns 270 and 280. The active regions 240, 250 and 260 may include a source region 240, a floating body 250, and a drain region 260, and the gate patterns 270 and 280 may include a gate electrode 270 and a gate insulating layer 280.

In the exemplary embodiment, the floating body 250 may include an upper floating body 250*a* into which impurity ions may be implanted at a first concentration and a main floating body 250*b* into which impurity ions may be implanted at a second concentration. More specifically, the upper floating body 250*a* may be implanted with impurity ions at a higher concentration than the main floating body 250*b*. That is, the first concentration may be higher than the second concentration. This is to further enhance charge storage abilities in the upper floating body 250*a*, and maintain lower leakage current and stable status with respect to adjacent source (bit) line disturbance in the main floating body 250*b*. In particular, when impurity ion implantation is performed on the floating body 250 at a higher concentration, an ability of storing charges may be increased. Therefore, the floating body 250 may be formed to have a high-concentration impurity ion region. However, in order to minimize leakage current, a portion of the floating body 250 in contact, e.g., direct contact, with the source region 240 or the drain region 260 may be implanted with low-concentration impurity ions. The floating body 250 may further include a flank floating body 250*c*.

In addition, a junction between the upper floating body 250*a* and the main floating body 250*b* may be schematically represented by a dashed line. The lines are illustrated for clarity only. In particular, it is noted that when two regions having different impurity implantation concentrations are adjacent to each other, impurity ion diffusion may occur between the two regions, so that the junction may not be an exact straight line as the dotted line, i.e., the impurity concentration may be gradually changed. Therefore, various exemplary embodiments described herein may be understood in that respect.

Descriptions of the substrate 210, a bulk 220, the buried insulating layer 230, the source region 240, the drain region 260, the flank floating body 250*c*, the gate pattern 270, and the gate pattern 280 correspond to description of respective elements in the semiconductor memory device described previously with reference to FIGS. 1-2B and, therefore, will not be repeated. It is further noted that with the exception of the impurity concentration discussed above, the floating body 250 may be substantially the same, e.g., structurally, as the floating body 150 of FIGS. 1-2A.

Figure 4A:
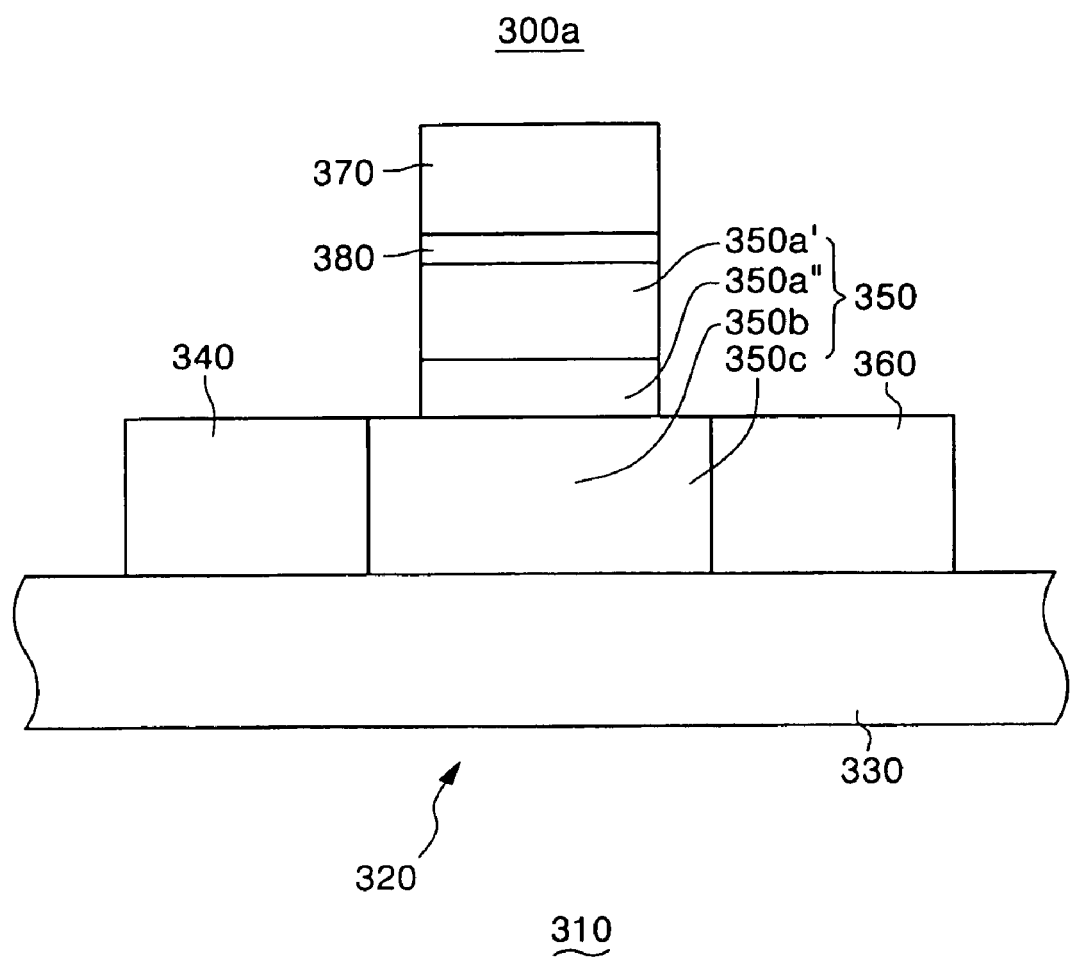
FIG. 4A illustrates a schematic cross-sectional view of a unit cell of a capacitorless 1T semiconductor memory device according to still another exemplary embodiment.

FIG. 4A illustrates a schematic cross-sectional view of a unit cell of a capacitorless 1T semiconductor memory device according to still another exemplary embodiment. FIG. 4A illustrates a cross-sectional view corresponding to the configuration illustrated in FIG. 2A, i.e., a cross-section along line I-I' of a semiconductor memory device configured as the semiconductor memory device of FIG. 1. Referring to FIG. 4A, a unit cell 300 may include a buried insulating layer 330 formed on a substrate 310, active regions 340, 350, and 360 formed on the buried insulating layer 330, and gate patterns 370 and 380. The active regions 340, 350 and 360 may include a source region 340, a floating body 350, and a drain region 360, and gate patterns 370 and 380 may include a gate electrode 370 and a gate insulating layer 380.

The floating body 350 may include a first upper floating body 350*a'*, a second upper floating body 350*a"*, a main floating body 350*b*, and a flank floating body 350*c*. As illustrated in FIG. 4A, the second upper floating body 350*a"* may be between the main floating body 350 and the first upper floating body 350'. The first upper floating body 350*a'* may be formed by implanting impurities at a first concentration, the second upper floating body 350*a"* may be formed by implanting impurities at a second concentration, and the main floating body 350*b* may be formed by implanting impurities at a third concentration.

For example, when the main floating body 350*b* is a region implanted with p-type impurities at the third concentration, the first upper floating body 350*a'* may be formed by implanting p-type impurities at the first concentration, and the second upper floating body 350*a"* may be formed by implanting n-type impurities at the second concentration. The first, second, and third concentrations may be differently set from each other, but may not necessarily have different concentrations. For example, the first concentration may be either higher or not than the third concentration, and the second concentration may exhibit the highest concentration. In another example, the three concentrations may be substantially the same. In yet another example, the first concentration may be the highest concentration, the third concentration may be the lowest concentration, and the second concentration may have a value between the first and third concentrations.

For example, if the first upper floating body 350*a'* is implanted with high-concentration impurity ions, charge storage abilities may be increased. The second upper floating body 350*a"* may have a lower concentration than the first concentration to increase resistance to leakage current. More specifically, the second upper floating body may prevent effects brought on by source (bit) line disturbance from being transferred to the first upper floating body 350*a'*.

In the drawings, the size and volume of each element is illustrated for clarity, and its absolute or relative size is not defined. That is, the size or volume of each element may be more idealized through various experiments. For example, the second upper floating body 350*a"* may be formed to be very small.

For example, if the source region 340 and the drain region 360 are implanted with n-type impurities, and the main floating body 350*b* is implanted with p-type impurities, p-type impurities may be implanted into the first upper floating body 350*a'*, and n-type impurities may be implanted into the second upper floating body 350*a"*.

Descriptions of the substrate 310, a bulk 320, the buried insulating layer 330, the source region 340, the drain region 360, the gate pattern 370, the gate pattern 380, and the flank floating body 350*c* correspond to the description of respective elements in the semiconductor memory device described previously with reference to FIGS. 1-2B and, therefore, will not be repeated. It is further noted that with the exception of the impurity concentration discussed above and the structure of the first and second upper bodies 350*a'* and 350*a"*, the floating body 350 may be substantially the same, e.g., structurally, as the floating body 150 of FIGS. 1-2A.

Figure 4B:
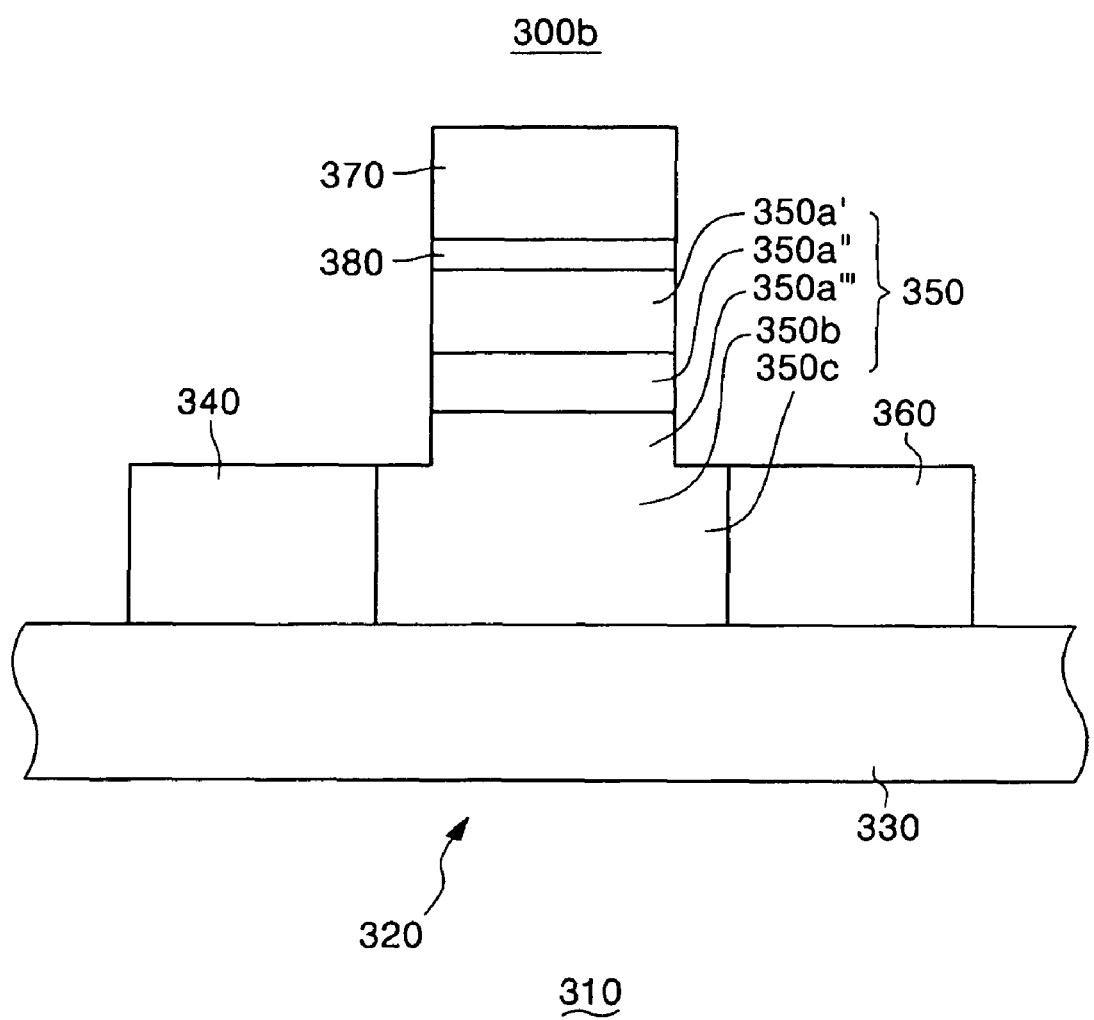
FIG. 4B illustrates a schematic cross-sectional view of a unit cell of a capacitorless 1T semiconductor memory device according to yet another exemplary embodiment.

FIG. 4B schematically illustrates a unit cell of a capacitorless 1T semiconductor memory device according to still another exemplary embodiment. More specifically, the structure of FIG. 4B is substantially the same as the structure of FIG. 4A, with the exception of having the second upper floating body 350a" further spaced from the source region 340 or the drain region 360.

In the exemplary embodiment, compared with the exemplary embodiment of FIG. 4A, a third upper floating body 350a'" may be formed between the second upper floating body 350a" and the main floating body 350b. The second upper floating body 350a" and the source region 340 or the drain region 360, into which the same type impurities are implanted, may be formed to be further spaced, so that electrical and physical characteristics of a device can be more stable.

In the exemplary embodiment, the third upper floating body 350a'" may be construed as the addition of an element, and may also be construed by extending the main floating body 350b in an upward direction. That is, an impurity ion implantation concentration of the third upper floating body 350a'" may not be necessarily separated from the main floating body 350b.

Figure 5A:
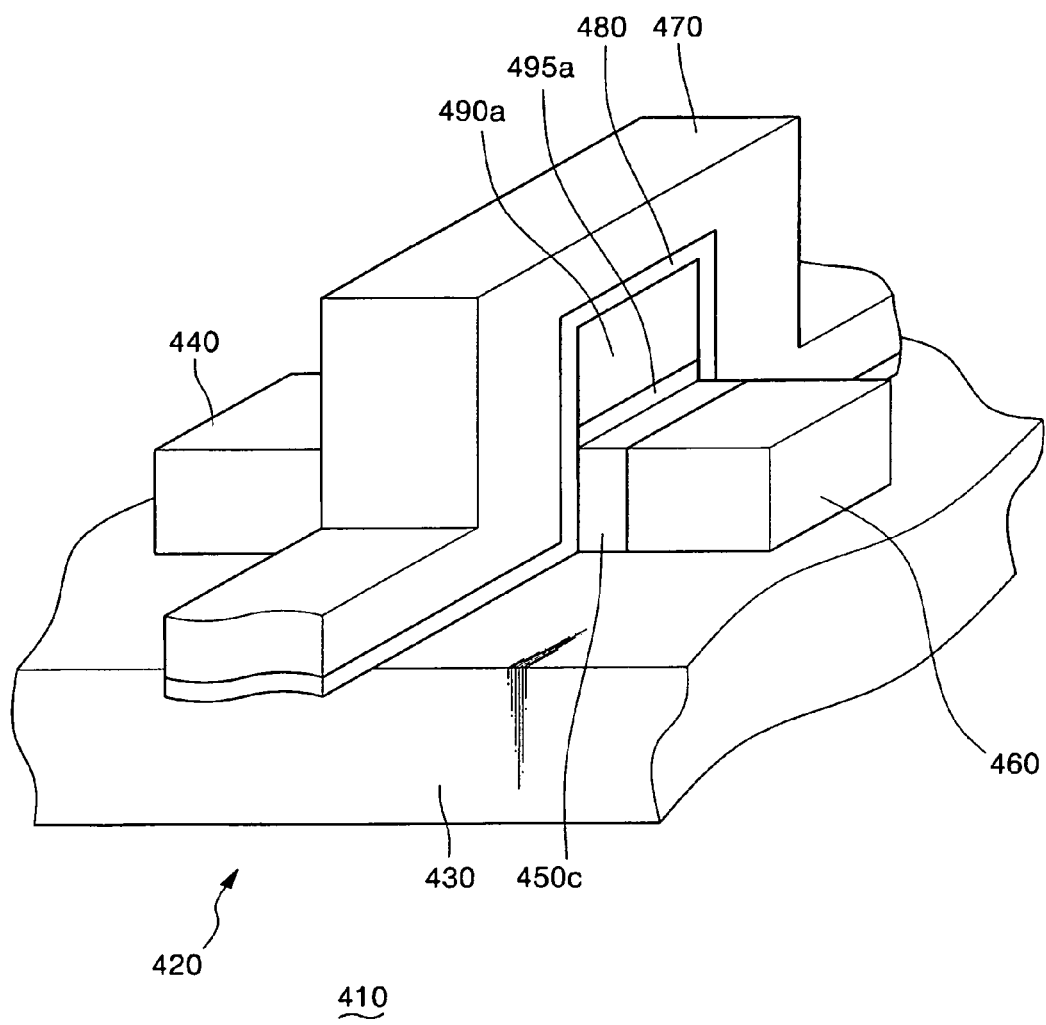
FIGS. 5A to 8B illustrate perspective and corresponding cross-sectional views of a unit cell of a capacitorless 1T semiconductor memory device according to exemplary other embodiments.
Figure 5B:
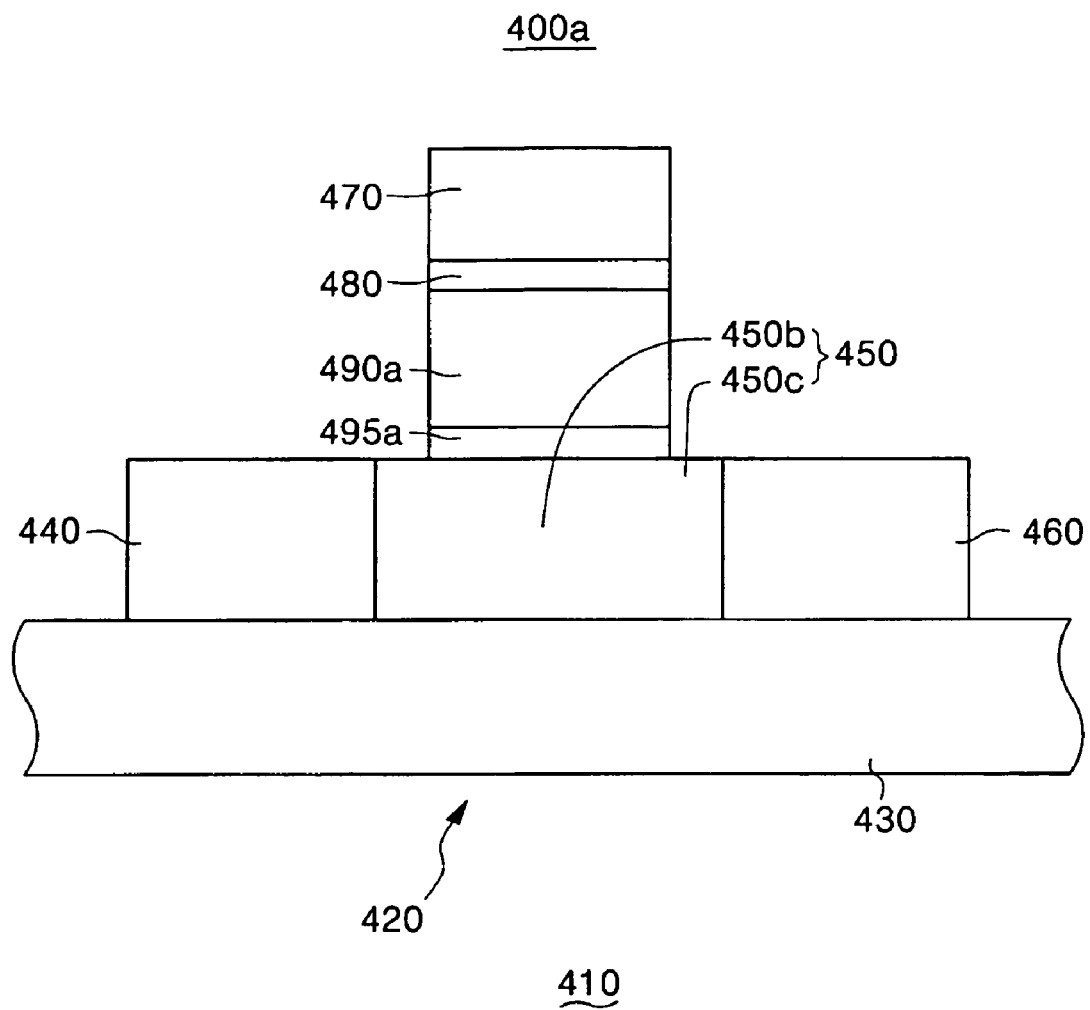

FIGS. 5A and 5B schematically illustrate a unit cell of a capacitorless 1T semiconductor memory device according to yet another exemplary embodiment. FIG. 5A illustrates a perspective view of a capacitorless 1T semiconductor memory device, and FIG. 5B illustrates a cross-sectional view taken along line I-I' in FIG. 5A. The semiconductor memory device of FIGS. 5A-5B is substantially the same as the semiconductor memory device described previously with reference to FIGS. 1-2A, with the exception of including first charge storage patterns 490a and 495a instead of the upper floating body 150a.

Referring to FIGS. 5A and 5B, a unit cell 400a may include a buried insulating layer 430 formed on a substrate 410, active regions 440, 450 and 460 formed on the buried insulating layer 430, first charge storage patterns 490a and 495a, and gate patterns 470 and 480. The active regions 440, 450, and 460 may include a source region 440, a floating body 450, and a drain region 460, the first charge storage patterns 490a and 495a may include a first charge storage unit 490a and a first charge storage insulating layer 495a, and the gate patterns 470 and 480 may include a gate electrode 470 and a gate insulating layer 480. In FIG. 5A, a flank floating body 450c is shown. The floating body 450 may include a main floating body 450b and the flank floating body 450c. It is noted that the terms "first charge storage pattern 490a" and "first charge storage unit 490a" may be used interchangeably hereinafter. Similarly, the terms "first charge storage patterns 495a" and "first charge storage insulating layer 495a" may be used interchangeably hereinafter.

In the exemplary embodiment, the first charge storage patterns 490a and 495a may be formed on the floating body 450. In particular, the first charge storage patterns 490a and 495a may be formed on, e.g., directly on, the main floating body 450b, i.e., the first charge storage pattern 495a may be formed between the main floating body 450b and the first charge storage pattern 490a.

The first charge storage unit 490a may be formed of a conductive material, and may be electrically insulated from other elements. Since the first charge storage unit 490a may require conductivity, it may be formed of, e.g., silicon implanted with n-type impurities, silicon implanted with p-type impurities, metal and/or metal silicide. The first charge storage unit 490a may be coupled to the gate electrode 470, and may accumulate and store charge depending on a voltage applied to the gate electrode 470.

In the exemplary embodiment, the first charge storage insulating layer 495a may be formed of an insulating material, e.g., a silicon oxide layer, and charges may be tunneled through the first charge storage layer 495a. That is, charges generated or stored in the first charge storage unit 490a and the floating body 450 may be FN tunneled through the first charge insulating layer 495a by a voltage applied to the gate electrode 470, or may be tunneled as hot carriers by a voltage applied to the source region 440 or the drain region 460. For example, during a write operation, charges may be tunneled into the first charge storage unit 490a from the floating body 450 to be stored as useful data, and during a read operation, charges may be tunneled into the floating body 450 from the first charge storage unit 490a, so that data may be externally output.

The FN tunneling or hot carrier tunneling may be selected and adapted depending on a method of controlling a unit cell of a capacitorless 1T semiconductor memory device. Also, the first charge storage insulating layer 495a may be formed to be as thick as charges can be tunneled, and the thickness may be variously set depending on operation conditions of a device. Also, any suitable technique in connection with the thickness of a tunneling insulating layer for charges to be tunneled may be used.

Figure 6A:
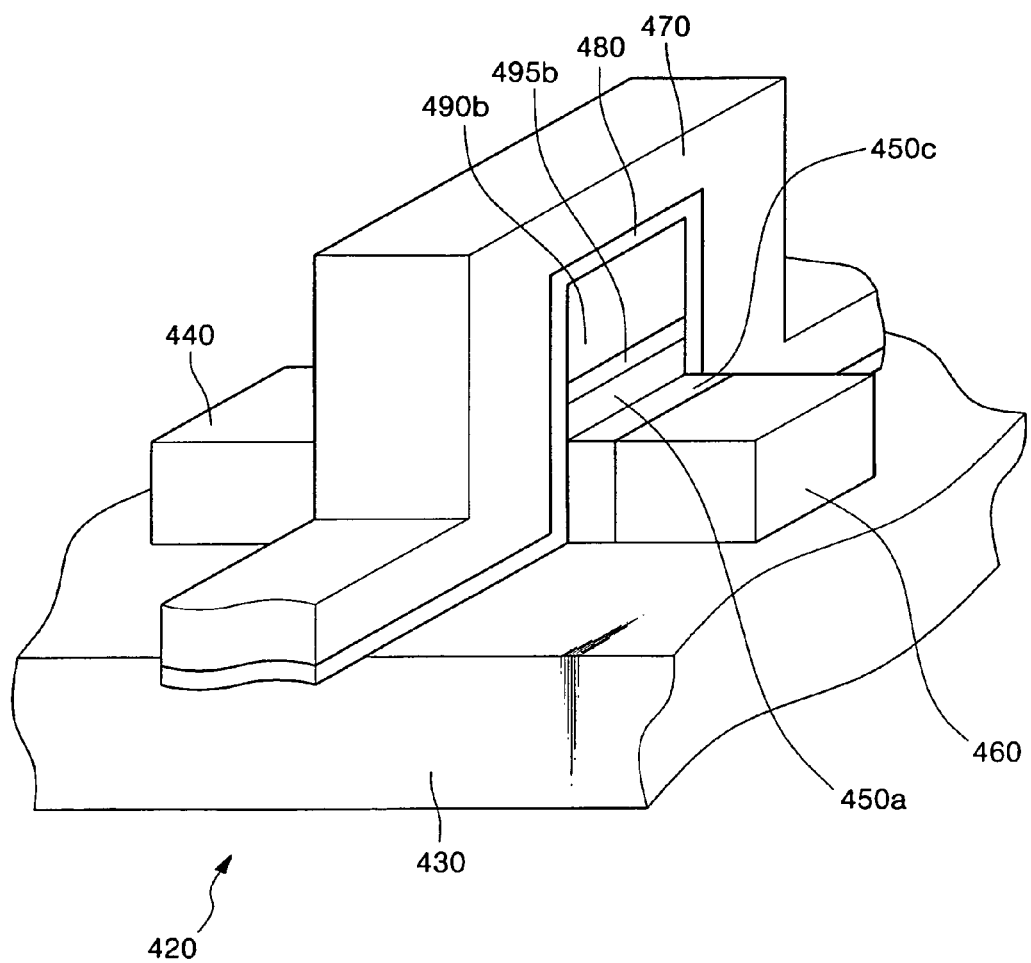
Figure 6B:
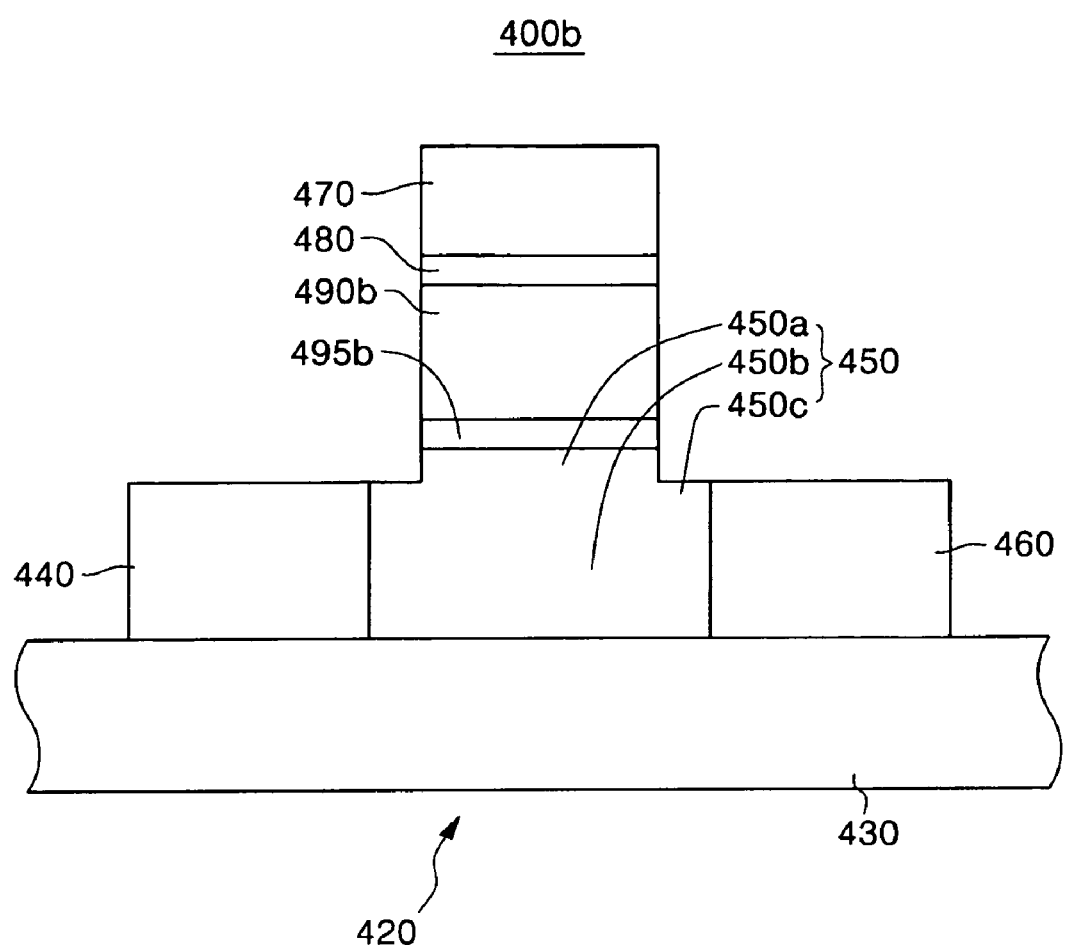

FIGS. 6A and 6B schematically illustrate a unit cell of a capacitorless 1T semiconductor memory device according to yet another exemplary embodiment. FIG. 6A illustrates a perspective view of a capacitorless 1T semiconductor memory device, and FIG. 6B illustrates a cross-sectional view along line I-I' of FIG. 6A. The semiconductor memory device of FIGS. 6A-6B is substantially the same as the semiconductor memory device described previously with reference to FIGS. 5A-5B, with the exception of including an upper floating body 450a between the first charge storage pattern 495a and the main floating body 450b.

Referring to FIGS. 6A and 6B, a unit cell 400b of a capacitorless 1T semiconductor memory device may include the buried insulating layer 430 formed on the substrate 410, active regions 440, 450, and 460 formed on the buried insulating layer 430, second charge storage patterns 490b and 495b, and gate patterns 470 and 480. The active regions 440, 450, and 460 may include the source region 440, the floating body 450, and the drain region 460, the second charge storage patterns 490b and 495b may include a second charge storage unit 490b and a second charge storage insulating layer 495b, and the gate patterns 470 and 480 may include the gate electrode 470 and the gate insulating layer 480. In FIG. 6A, an upper floating body 450a and the flank floating body 450c are shown. It is noted that the terms "second charge storage pattern 490b" and "second charge storage unit 490b" may be used interchangeably hereinafter. Similarly, the terms "second charge storage patterns 495b" and "second charge storage insulating layer 495b" may be used interchangeably hereinafter.

In the exemplary embodiment, compared with the unit cell 400a of the capacitorless 1T semiconductor memory device illustrated in FIGS. 5A and 5B, the upper floating body 450a may be formed between the second charge storage patterns 490b and 495b and the main floating body 450b. That is, the second charge storage patterns 490b and 495b may be formed to be further distant from the source region 440 or the drain region 460. In other words, the second charge storage patterns 490b and 495b may be formed on an upwardly elevated location with respect to the main floating body 450b. The exemplary embodiment has been sufficiently explained with reference to the above drawings and descriptions thereof, and thus further descriptions will not be repeated.

Figure 7A:
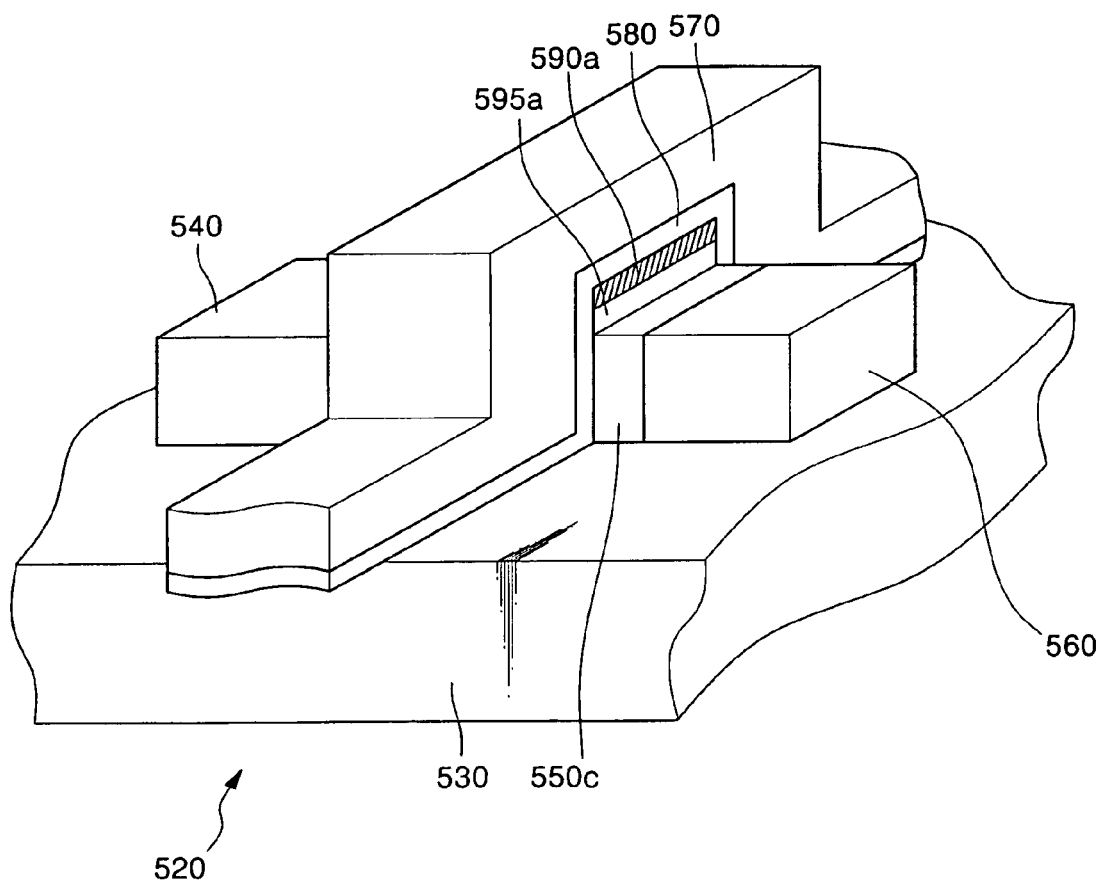
Figure 7B:
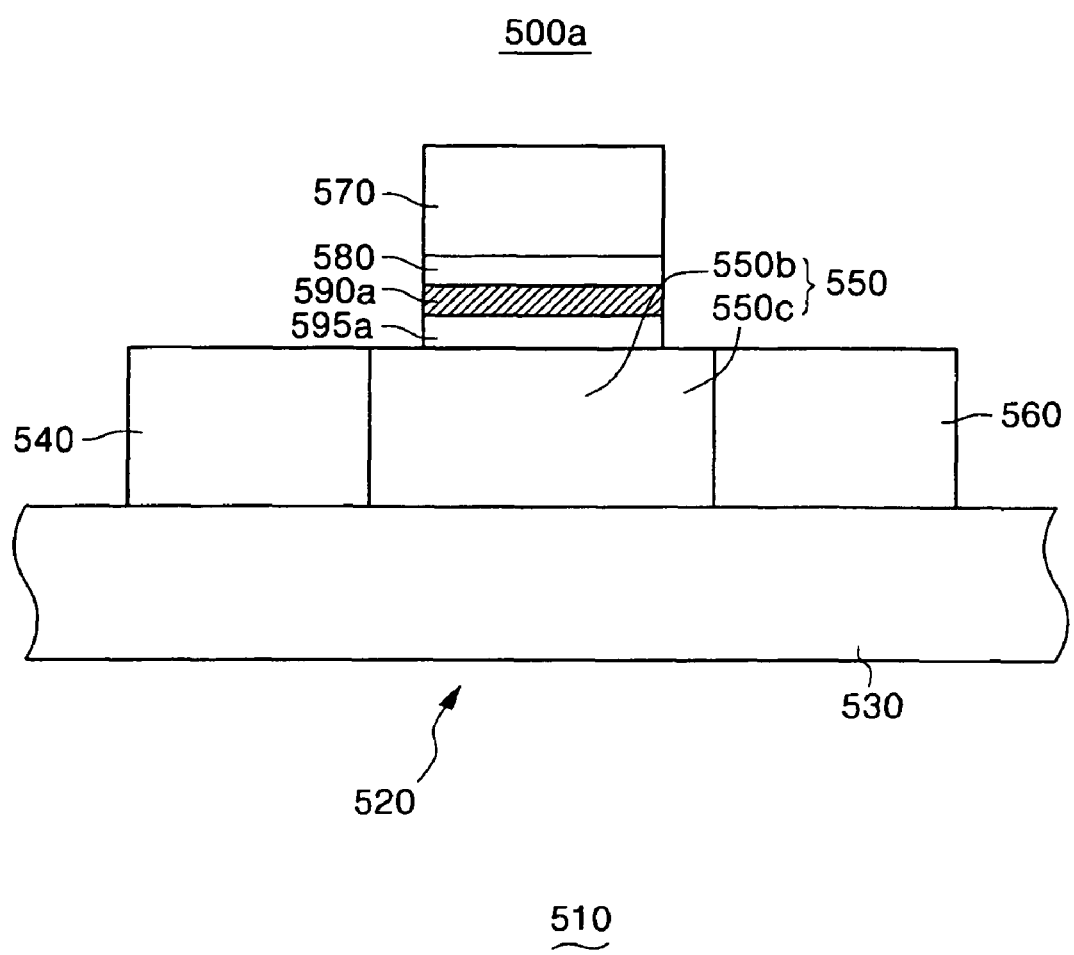

FIGS. 7A and 7B schematically illustrate a unit cell of a capacitorless 1T semiconductor memory device according to yet another exemplary embodiment. FIG. 7A illustrates a perspective view of a capacitorless 1T semiconductor memory device, and FIG. 7B illustrates a cross-sectional view taken along line I-I' of FIG. 7A. The semiconductor memory device of FIGS. 7A-7B is substantially the same as the semiconductor memory device described previously with reference to FIGS. 5A-5B, with the exception of including third charge storage patterns instead of the first charge storage patterns.

Referring to FIGS. 7A and 7B, a unit cell 500*a* of a capacitorless 1T semiconductor memory device may include a buried insulating layer 530 formed on a substrate 510, active regions 540, 550, and 560 formed on the buried insulating layer 530, third charge storage patterns 590*a* and 595*a*, and gate patterns 570 and 580. The active regions 540, 550, and 560 may include a source region 540, a floating body 550 and a drain region 560, the third charge storage patterns 590*a* and 595*a* may include a third charge storage unit 590*a* and a third charge storage insulating layer 595*a*, and the gate patterns 570 and 580 may include a gate electrode 570 and a gate insulating layer 580. In FIG. 7A, a flank floating body 550*c* is shown. It is noted that the terms "third charge storage pattern 590*a*" and "third charge storage unit 590*a*" may be used interchangeably hereinafter. Similarly, the terms "third charge storage patterns 595*a*" and "third charge storage insulating layer 595*a*" may be used interchangeably hereinafter.

In the exemplary embodiment, the third charge storage patterns 590*a* and 595*a* may be formed on the floating body 550, and in particular, on a main floating body 550*b*.

The third charge storage unit 590*a* may be formed of a dielectric capable of trapping charges. For example, the third charge storage unit 590*a* may be formed of silicon nitride. However, it is not limited to the silicon nitride, and materials that are known as high-k dielectric materials in the art, such as a silicon oxynitride layer, a hafnium oxide layer, an aluminum oxide layer, a titanium oxide layer, a tantalum oxide layer, or BST, may be used. The third charge storage unit 590*a* may trap charges tunneled through the third charge storage insulating layer 595*a*. That is, the third charge storage patterns 590*a* and 595*a* may be one type of charge trap patterns, so the third charge storage unit 590*a* may be a charge trap unit.

In the exemplary embodiment, since the third charge storage insulating layer 595*a* may function to store charges like the first and second charge storage insulating layers 495*a* and 495*b* illustrated in FIGS. 5A to 6B, such operation will be understood with reference to descriptions thereof.

Figure 8A:
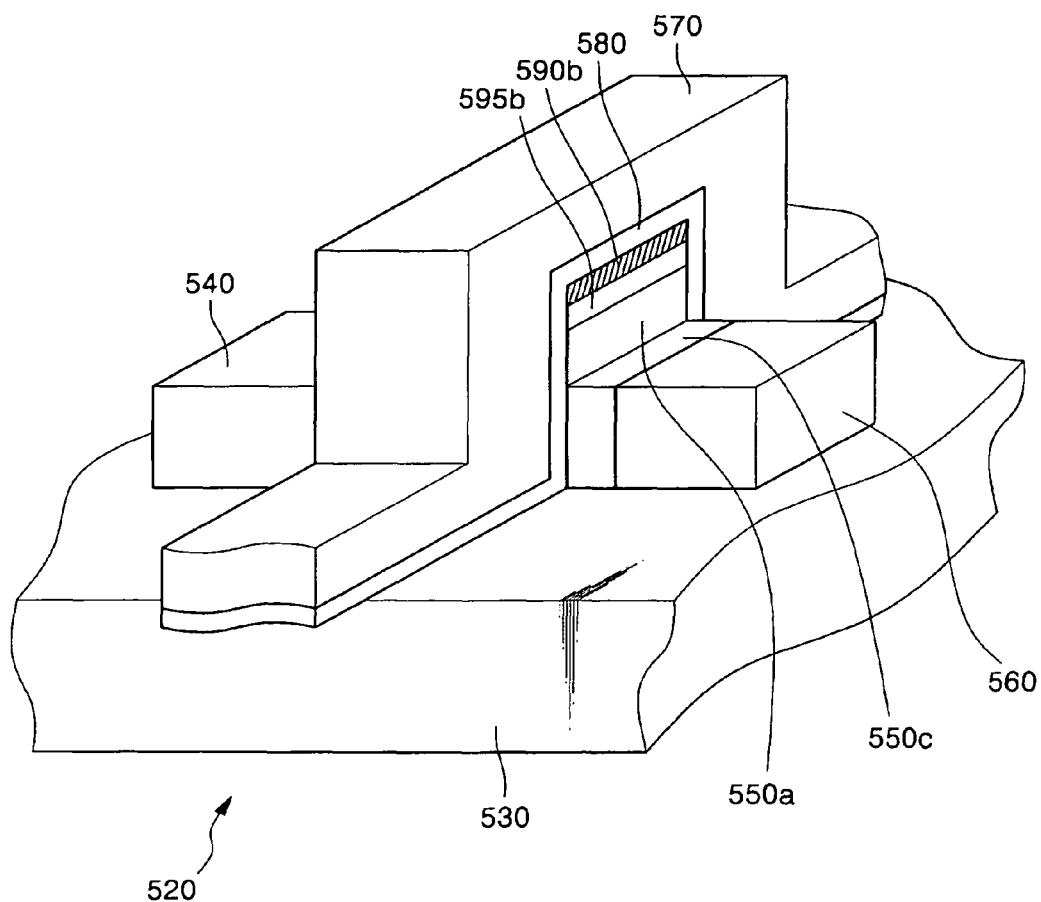
Figure 8B:
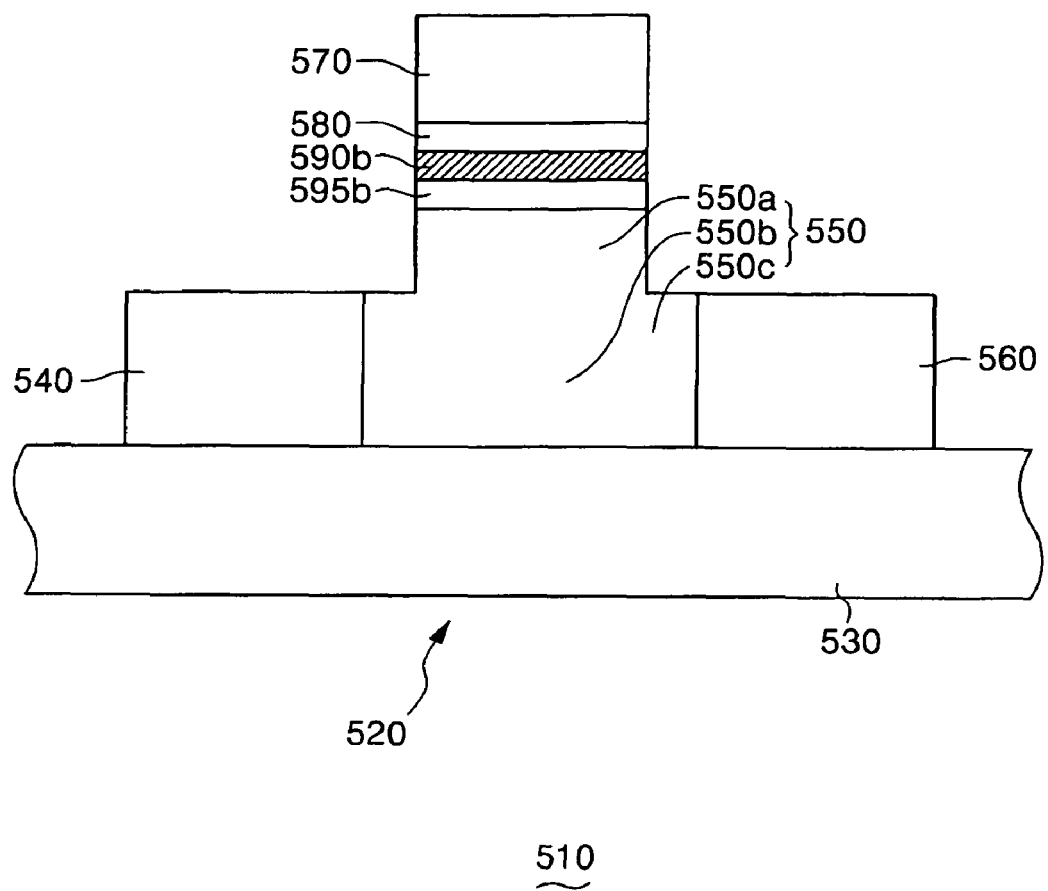

FIGS. 8A and 8B schematically illustrate a unit cell of a capacitorless 1T semiconductor memory device according to yet another exemplary embodiment. FIG. 8 illustrates a perspective view of a capacitorless 1T semiconductor memory device, and FIG. 8B illustrates a cross-sectional view taken along line I-I' of FIG. 8A. The semiconductor memory device of FIGS. 8A-8B is substantially the same as the semiconductor memory device described previously with reference to FIGS. 6A-6B, with the exception of including fourth charge storage patterns instead of the second charge storage patterns.

Referring to FIG. 8A, a unit cell 500*b* of a capacitorless 1T semiconductor memory device may include the buried insulating layer 530 formed on the substrate 510, active regions 540, 550, and 560 formed on the buried insulating layer 530, fourth charge storage patterns 590*b* and 595*b*, and gate patterns 570 and 580. The active regions 540, 550, and 560 may include the source region 540, the floating body 550 and the drain region 560, the fourth charge storage patterns 590*b* and 595*b* may include a fourth charge storage unit 590*b* and a fourth charge storage insulating layer 595*b*, and the gate patterns 570 and 580 may include the gate electrode 570 and the gate insulating layer 580. In FIG. 8A, an upper floating body 550*a* and a flank floating body 550*c* are shown. It is noted that the terms "fourth charge storage pattern 590*b*" and "fourth charge storage unit 590*b*" may be used interchangeably hereinafter. Similarly, the terms "fourth charge storage patterns 595*b*" and "fourth charge storage insulating layer 595*b*" may be used interchangeably hereinafter.

In the exemplary embodiment, compared with the unit cell 500*a* of the capacitorless 1T semiconductor memory device illustrated in FIGS. 7A and 7B, the upper floating body 550*a* may be formed between the fourth charge storage patterns 590*b* and 595*b* and the main floating body 550*b*. That is, the fourth charge storage patterns 590*b* and 595*b* may be formed to be further distant from the source region 540 or the drain region 560. In other words, the fourth charge storage patterns 590*b* and 595*b* may be formed on an upwardly elevated location with respect to the main floating body 550*b*. The exemplary embodiment would have been sufficiently understood based on the drawings and descriptions thereof, and thus further descriptions will be omitted.

Capacitorless 1T semiconductor memory devices according to exemplary embodiments may increase charge storage abilities of a floating body or elements capable of storing charges, and may reduce leakage current, so that characteristics of the above-described capacitorless 1T semiconductor memory device may be enhanced.

As described above, in a capacitorless 1T semiconductor device according to exemplary embodiments, data storage abilities, data retention abilities, and data sensing margins may be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A capacitorless one-transistor (1T) semiconductor device, comprising:
 a buried insulating layer on a substrate;
 an active region on the buried insulating layer, the active region including a source region, a drain region, and a floating body between the source region and the drain region; and
 a gate pattern on the floating body,
 wherein the floating body includes a main floating body and a first upper floating body directly contacting and being integral with each other, top surfaces of the main floating body and at least one of the source region and the drain region facing away from the buried insulating layer being substantially coplanar, and the first upper floating body being between the main floating body and the gate pattern, and
 wherein the floating body further includes a flank floating body, the flank floating body having a top surface at a lower height than a top surface of the upper floating body, the flank floating body being positioned between the main floating body and at least one of the source and drain regions.

2. The device as claimed in claim 1, wherein the gate pattern includes:
 a gate insulating layer on the first upper floating body; and
 a gate electrode on the gate insulating layer, the gate electrode overlapping a top surface and at least one side surface of the first upper floating body.

3. The device as claimed in claim 2, wherein the gate electrode directly contacts at least two side surfaces of the first upper floating body and at least two side surfaces of the main floating body.

4. The device as claimed in claim 1, wherein the first upper floating body includes first type impurity ions at a first concentration, and the main floating body includes the first type impurity ions at a second concentration, the first concentration being higher than the second concentration.

5. The device as claimed in claim 4, wherein the floating body further includes a second upper floating body, the first upper floating body being between the second floating body and the main floating body.

6. The device as claimed in claim 5, wherein the second upper floating body includes second type impurity ions at a third concentration.

7. The device as claimed in claim 1, wherein the flank floating body includes no overlaps with the gate electrode.

8. The device as claimed in claim 7, wherein the flank floating body extends in a horizontal direction from the first upper floating body.

9. The device as claimed in claim 1, wherein the flank floating body includes the same impurities as the main floating body at a substantially same concentration or lower.

10. The device as claimed in claim 3, wherein the main floating body and the first upper floating body are integral with each other, the first upper floating body extending from the top surface of the main floating body toward the gate pattern to be above top surfaces of the source and drain regions.

11. The device as claimed in claim 10, wherein the charge storage unit includes a dielectric material.

12. A capacitor-less one-transistor (1T) semiconductor device, comprising:
- a buried insulating layer on a substrate;
- an active region on the buried insulating layer, the active region including a source region, a drain region, and a floating body between the source region and the drain region; and
- a gate pattern on the floating body,
- wherein the floating body includes a main floating body and a charge storage pattern, side surfaces of the main floating body directly contacting the gate pattern, top surfaces of the main floating body and at least one of the source region and the drain region facing away from the buried insulating layer being substantially coplanar, and the charge storage pattern being between the main floating body and the gate pattern,
- wherein the charge storage pattern includes a charge storage insulating layer on the main floating body and a charge storage unit on the charge storage insulating layer, and
- wherein the floating body includes a flank floating body having a top surface at a lower height than the charge storage pattern and adjacent to at least one of the source and drain regions, the flank floating body having no overlaps with the gate electrode.

13. The device as claimed in claim 12, wherein the charge storage unit includes a conductor.

14. The device as claimed in claim 13, wherein the charge storage unit includes at least one of doped silicon, metal, and metal silicide.

15. The device as claimed in claim 12, wherein the gate pattern includes a gate insulating layer on the charge storage pattern, and a gate electrode on the gate insulating layer, the gate electrode overlapping at least two side surfaces of the charge storage pattern.

16. The device as claimed in claim 12, further comprising an upper floating body between the main floating body and the charge storage insulating layer, the upper floating body including same impurity ions as the main floating body at a higher concentration.

17. The device as claimed in claim 11, wherein the charge storage unit includes at least one of a silicon nitride layer, a silicon oxynitride layer, a hafnium oxide layer, an aluminum oxide layer, a titanium oxide layer, a tantalum oxide layer, and a carbon-based layer.

18. The device as claimed in claim 1, further comprising a charge storage pattern between the first upper floating body and the gate pattern, the charge storage pattern including a charge storage insulating layer on the main floating body and a charge storage unit on the charge storage insulating layer.

* * * * *